United States Patent
Hayashi et al.

(10) Patent No.: US 8,110,436 B2
(45) Date of Patent: Feb. 7, 2012

(54) METHOD FOR MANUFACTURING FIELD-EFFECT TRANSISTOR

(75) Inventors: Ryo Hayashi, Yokohama (JP); Hisato Yabuta, Machida (JP); Yoshinori Tateishi, Yokohama (JP); Nobuyuki Kaji, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 163 days.

(21) Appl. No.: 12/671,054

(22) PCT Filed: Sep. 25, 2008

(86) PCT No.: PCT/JP2008/067877
§ 371 (c)(1),
(2), (4) Date: Jan. 28, 2010

(87) PCT Pub. No.: WO2009/041713
PCT Pub. Date: Apr. 2, 2009

(65) Prior Publication Data
US 2010/0203673 A1    Aug. 12, 2010

(30) Foreign Application Priority Data

Sep. 26, 2007  (JP) ................. 2007-249231
Sep. 1, 2008   (JP) ................. 2008-223480

(51) Int. Cl.
*H01L 21/00* (2006.01)
(52) U.S. Cl. ... 438/104; 438/151; 438/158; 257/E21.46; 257/E21.459
(58) Field of Classification Search ............. 438/104, 438/151, 158; 257/72, 197, 368, E21.46, 257/E21.459, E21.411
See application file for complete search history.

(56) References Cited

U.S. PATENT DOCUMENTS

| | | | |
|---|---|---|---|
| 6,132,817 A | 10/2000 | Tokutake et al. | 427/578 |
| 7,411,209 B2 | 8/2008 | Endo et al. | 257/43 |
| 7,468,304 B2 | 12/2008 | Kaji et al. | 438/308 |
| 2005/0199959 A1 * | 9/2005 | Chiang et al. | 257/368 |
| 2006/0110867 A1 | 5/2006 | Yabuta et al. | 438/151 |
| 2006/0244107 A1 | 11/2006 | Sugihara et al. | 257/646 |
| 2007/0054507 A1 | 3/2007 | Kaji et al. | 438/795 |
| 2007/0194379 A1 | 8/2007 | Hosono et al. | 257/347 |
| 2009/0045399 A1 | 2/2009 | Kaji et al. | 257/43 |
| 2009/0072232 A1 | 3/2009 | Hayashi et al. | 257/43 |
| 2010/0044703 A1 | 2/2010 | Yabuta et al. | 257/43 |
| 2010/0053041 A1 | 3/2010 | Abe et al. | 345/76 |
| 2010/0059751 A1 | 3/2010 | Takahashi et al. | 257/57 |
| 2010/0085081 A1 | 4/2010 | Ofuji et al. | 326/102 |

FOREIGN PATENT DOCUMENTS

| | | |
|---|---|---|
| EP | 1 984 954 A0 | 10/2007 |
| JP | 11-97438 A | 4/1999 |
| JP | 2002-076356 A | 3/2002 |
| JP | 2006-0165531 A | 6/2006 |
| JP | 2007109840 A * | 4/2007 |
| JP | 2007-311404 A | 11/2007 |
| WO | WO 2007/119386 A1 | 10/2007 |

* cited by examiner

*Primary Examiner* — Charles Garber
*Assistant Examiner* — Abdulfattah Mustapha
(74) *Attorney, Agent, or Firm* — Fitzpatrick, Cella, Harper & Scinto

(57) ABSTRACT

A method for manufacturing a field-effect transistor is provided. The field-effect transistor includes on a substrate a source electrode, a drain electrode, an oxide semiconductor layer, an insulating layer and a gate electrode. The method includes, after forming the insulating layer on the oxide semiconductor layer, an annealing step of increasing the electrical conductivity of the oxide semiconductor layers by annealing in an atmosphere containing moisture. The steam pressure at the annealing step is higher than the saturated vapor pressure in the atmosphere at the annealing temperature.

14 Claims, 7 Drawing Sheets

METHOD FOR MANUFACTURING FIELD-EFFECT TRANSISTOR

TECHNICAL FIELD

The present invention relates to a method for manufacturing a field-effect transistor. More particularly, the present invention relates to a method for manufacturing a field-effect transistor having an oxide film as a semiconductor layer.

BACKGROUND ART

In recent years, thin film transistors (TFTs) including a channel layer of a polycrystalline transparent conductive ZnO-based oxide thin film have actively been developed (Japanese Patent Application Laid-Open No. 2002-076356).

Japanese Patent Application Laid-Open No. 2002-076356 states that because the thin film can be formed at low temperature and is transparent to visible light, a flexible transparent TFT can be formed on a substrate such as a plastic plate or a film.

However, a ZnO-based compound cannot form a stable amorphous phase at room temperature, but forms a polycrystalline phase. It is therefore difficult to increase electron mobility because of scattering at grain boundaries. Furthermore, the shape and the interconnection of polycrystalline grains vary widely with the film-forming method. This also produces variations in characteristics of TFT devices.

To solve the above-mentioned problems, recently, a thin film transistor containing an In—Ga—Zn—O amorphous oxide has been reported (K. Nomura et. al., Nature 432, 488 (2004)). This transistor can be formed on a plastic substrate or a glass substrate at room temperature. In addition, the transistor has a field-effect mobility approximately in the range of 6 to 9 $cm^2/Vs$ and of a normally-off type. Furthermore, the transistor is transparent to visible light. Further, by irradiating an In—Ga—Zn—O amorphous oxide active layer with an energy beam such as an electron beam or a particle beam, the conductivity can be changed (US 2007/0054507 A1).

Further, it has been reported that when annealing is performed in an atmosphere containing moisture, which is known as steam oxidation, strong oxidative power of steam can improve dielectric strength of a gate insulating layer composed of a silicon oxide film and can reform an interface between a semiconductor and an oxide insulating layer (Japanese Patent No. 3225268).

In addition, Japanese Patent Application Laid-Open No. 2007-311404 discloses a production process including a step in which after an oxide semiconductor is formed, heat treatment is carried out in an oxidative gas atmosphere in order to obtain an oxide semiconductor transistor stable in long-term operation. It is also disclosed that oxygen radicals, oxygen, steam or ozone is used as the oxidative gas.

TFTs containing amorphous oxides, including amorphous In—Ga—Zn—O, were studied, and it was found that the transistor characteristics of the TFTs vary in some cases.

The variations in transistor characteristics can cause variations in operation of organic light-emitting diodes (LEDs) and liquid crystals driven by the transistors, for example, in a pixel circuit of a display. The variations may be caused by parasitic resistance generated between a source electrode and a channel and between a drain electrode and a channel.

The present invention has been made in view of the above problems, and therefore an object of the present invention is to provide a method for manufacturing a field-effect transistor which can reduce the above-mentioned parasitic resistance.

DISCLOSURE OF THE INVENTION

An object of the present invention is to provide a method for manufacturing a field-effect transistor having on a substrate at least a source electrode, a drain electrode, an oxide semiconductor layer, an insulating layer and a gate electrode, the method including, after forming the insulating layer on the oxide semiconductor layer, an annealing step of increasing the electrical conductivity of the oxide semiconductor layer by annealing in an atmosphere containing moisture, where the steam pressure at the annealing step is higher than the saturated vapor pressure in the atmosphere at the annealing temperature. In the method, the insulating layer is at least one of a gate insulating layer and a protective layer.

Another object of the present invention is to provide a field-effect transistor manufactured by the method described above.

A further object of the present invention is to provide a display apparatus in which an electrode of a display device is connected, on a substrate, to one of a source electrode and a drain electrode of the field-effect transistor, wherein the field-effect transistor is the field-effect transistor described above.

When annealing is performed in an atmosphere containing water, heavy water, steam or heavy water steam (hereinafter referred to as moisture), according to the method for manufacturing a field-effect transistor of the present invention, moisture passes through the insulating layer formed on the oxide semiconductor and diffuses in the oxide semiconductor layer. As a result, the conductivity of the oxide semiconductor layer can be increased.

In addition, when employing a structure which protects the channel regions of a field-effect transistor from a steam atmosphere, the conductivity in regions in contact with the source electrode and the drain electrode can be increased. This can reduce the parasitic resistance generated between the source electrode and the oxide semiconductor layer and between the drain electrode and the oxide semiconductor layer, and a field-effect transistor having excellent characteristics can be produced.

Further features of the present invention will become apparent from the following description of exemplary embodiments with reference to the attached drawings.

BRIEF DESCRIPTION OF THE DRAWINGS

FIG. 1A illustrates a top-gate stagger thin film transistor, FIG. 1B illustrates a top-gate/top-contact thin film transistor, FIG. 1C illustrates a bottom-gate reverse stagger thin film transistor, and FIG. 1D illustrates a bottom-gate/bottom-contact thin film transistor.

FIG. 12A illustrates a cross-sectional view when, in a top-gate stagger thin film transistor, carrying out the annealing step in an atmosphere containing moisture according to the present invention; FIG. 12B illustrates a cross-sectional view when, in a top-gate/top-contact thin film transistor, carrying out the annealing step in an atmosphere containing moisture according to the present invention; FIG. 12C illustrates a cross-sectional view when, in a bottom-gate reverse stagger thin film transistor, carrying out the annealing step in an atmosphere containing moisture according to the present invention; and FIG. 12D illustrates a cross-sectional view when, in a bottom-gate/bottom-contact thin film transistor, carrying out the annealing step in an atmosphere containing moisture according to the present invention.

BEST MODE FOR CARRYING OUT THE INVENTION

A method for manufacturing a field-effect transistor according to the present invention is described below in detail with reference to the drawings.

Figure 1A:
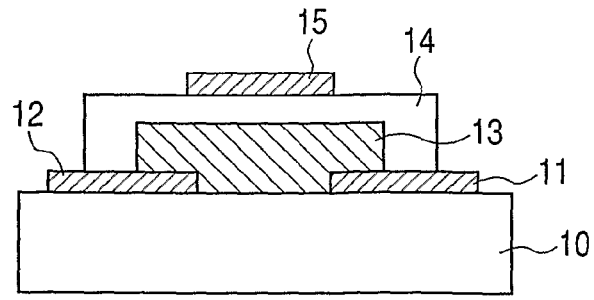
FIGS. 1A, 1B, 1C, and 1D are cross-sectional views illustrating exemplary structures of field-effect transistors according to the present invention.
Figure 1B:
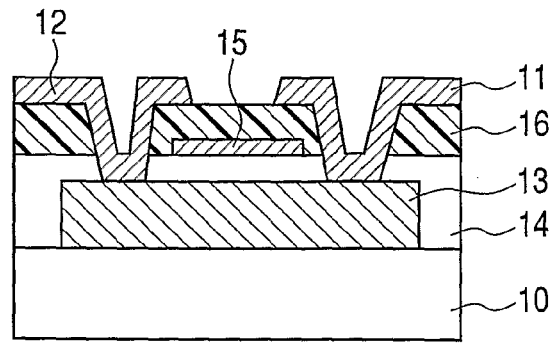
Figure 1C:
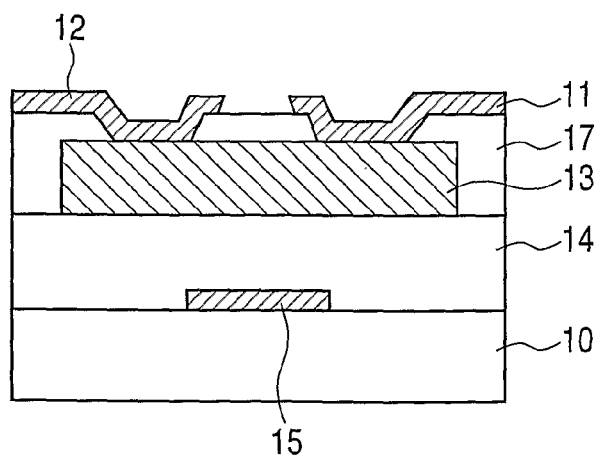
Figure 1D:
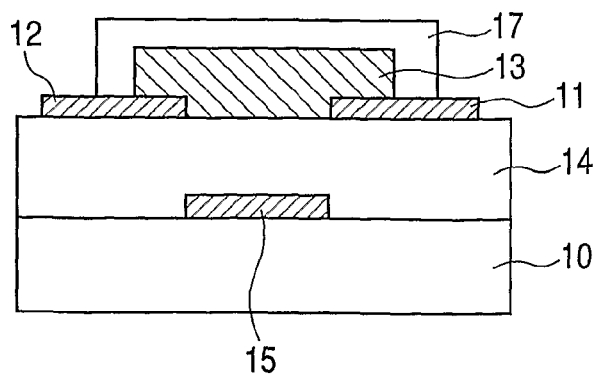

FIGS. 1A to 1D illustrate exemplary structures of field-effect transistors according to the present invention. FIG. 1A illustrates an exemplary top-gate stagger thin film transistor, FIG. 1B illustrates an exemplary top-gate/top-contact thin film transistor, FIG. 1C illustrates an exemplary bottom-gate reverse stagger thin film transistor, and FIG. 1D illustrates an exemplary bottom-gate/bottom-contact thin film transistor.

In FIGS. 1A to 1D, a numeral 10 denotes a substrate, a numeral 11 denotes a source electrode, a numeral 12 denotes a drain electrode, a numeral 13 denotes an oxide semiconductor layer, a numeral 14 denotes a gate insulating layer, a numeral 15 denotes a gate electrode, a numeral 16 denotes an interlayer insulating layer, and a numeral 17 denotes a protective layer.

Figure 2:
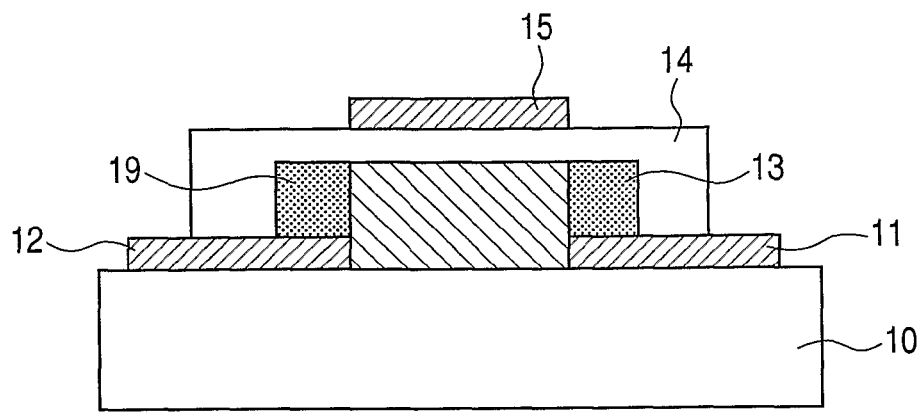
FIG. 2 is a cross-sectional view of a transistor which schematically illustrates regions where the electrical conductivity of an oxide semiconductor is increased during the course of manufacturing a top-gate stagger thin film transistor in annealing in an atmosphere containing moisture according to the present invention.

FIGS. 2 to 6 are cross-sectional views of the transistors which schematically illustrate regions where the electrical conductivity of an oxide semiconductor is increased at the step of annealing in an atmosphere containing moisture according to the present invention. FIG. 2 corresponds to FIG. 1A, FIG. 3 corresponds to FIG. 1B, FIG. 4 and FIG. 5 correspond to FIG. 1C, and FIG. 6 corresponds to FIG. 1D.

In the following, FIG. 2 is taken as an example to describe in order the steps in the manufacturing method according to the present invention.

An electrode layer is formed on the substrate 10 which is illustrated in FIG. 2. The source electrode 11 and the drain electrode 12 are later formed from the electrode layer. The electrode layer may be formed by sputtering, pulsed laser deposition (PLD), electron-beam evaporation, or chemical vapor deposition (CVD). The substrate 10 may be a glass plate, a plastic plate, or a plastic film. Further, as the electrode material, a material having good electrical conductivity can preferably be used. Examples of the electrically conductive material include oxide conductors such as $In_2O_3$:Sn, ZnO, and $In_xZn_yO$, and metallic electrode materials such as Pt, Au, Ni, Al, and Mo.

Next, patterns for the source electrode 11 and the drain electrode 12 are formed by photolithography.

An oxide semiconductor layer 13 is formed from an oxide film on the substrate 10 having the patterned source electrode 11 and the patterned drain electrode 12. The oxide semiconductor layer 13 may be formed by sputtering, pulsed laser deposition (PLD), electron-beam evaporation, or chemical vapor deposition (CVD). Further, as the oxide semiconducting material, a material can be used which has semiconducting properties and whose electrical conductivity is increased by annealing in an atmosphere containing moisture. Examples of the oxide semiconducting material include indium oxides and zinc oxides. The oxide semiconducting material is composed preferably of an amorphous oxide material, and more preferably of an amorphous oxide material containing In, Ga, and Zn.

The gate insulating layer 14 is formed on the oxide semiconductor layer 13. The gate insulating layer 14 may be formed by sputtering, pulsed laser deposition (PLD), electron-beam evaporation, or chemical vapor deposition (CVD). The gate insulating material has only to have good insulating properties. Examples of the insulating material include $Al_2O_3$, $Y_2O_3$, $HfO_2$, and mixed-crystal compounds composed of at least two of these compounds. Nevertheless, it is desirable that the gate insulating material is an oxide in order to obtain a sufficient effect when annealing is performed in an atmosphere containing moisture after the gate insulating layer is formed. That is, the insulating layer (including such a protective layer as described later) formed on the oxide semiconductor layer is preferably an oxide insulating layer, and from the viewpoint of appropriate steam permeability and compatibility with the oxide semiconductor, it is most preferable that $SiO_x$ can be used in sputtering.

Then, the gate electrode 15 is formed on the gate insulating layer 14. The gate electrode 15 may be formed by sputtering, pulsed laser deposition (PLD), electron-beam evaporation, or chemical vapor deposition (CVD). As the electrode material, a material having electrical conductivity may preferably be used. For example, oxide conductors such as $In_2O_3$:Sn, ZnO, and $In_xZn_yO$ and metallic electrode materials such as Pt, Au, Ni, Al, and Mo may be used. Here, the pattern of the gate electrode 15 is formed by photolithography. The location where the pattern is formed may be anywhere if, taking into consideration the positional relationship between the source electrode 11 and the drain electrode 12, transistor characteristics can be obtained.

Next, the annealing step in an atmosphere containing water, heavy water, steam, or heavy water steam is carried out, which characterizes the present invention. In this case, it is desirable that the steam pressure is higher than the saturated vapor pressure in the atmosphere. In the present invention, the "saturated vapor pressure in the atmosphere" refers to the saturated vapor pressure in the air (which is composed primarily of nitrogen and oxygen) at 1 atm. Where such annealing according to the present invention is performed, when using a metal having low steam permeability as the gate electrode, in regions that are not covered with the gate electrode 15 when viewed from the gate electrode 15 side, stream passes through the gate insulating layer 14 and the electrical conductivity of an oxide semiconductor 19 can be increased, as illustrated in FIG. 2. More specifically, by using the gate electrode 15 as a mask, the electrical conductivity of the oxide semiconductor in regions connecting with the source electrode 11 and the drain electrode 12 can be increased while a portion forming a channel is protected. When annealing is performed with moisture according to the present invention, because the oxide semiconductor layer is covered with the gate insulating layer 14, compared with a case where the interface of the semiconductor is exposed, the influence of adhesion of impurities can be reduced, and thus, stable characteristics can be obtained.

When annealing is carried out in an atmosphere containing moisture before forming the gate insulating layer 14, and the step of increasing the electrical conductivity of the oxide semiconductor is performed, depending upon the conditions for forming the gate insulating layer 14, the electrical conductivity of the oxide semiconductor is changed again, so that the effects of the present invention cannot be sufficiently exhibited.

Figure 3:
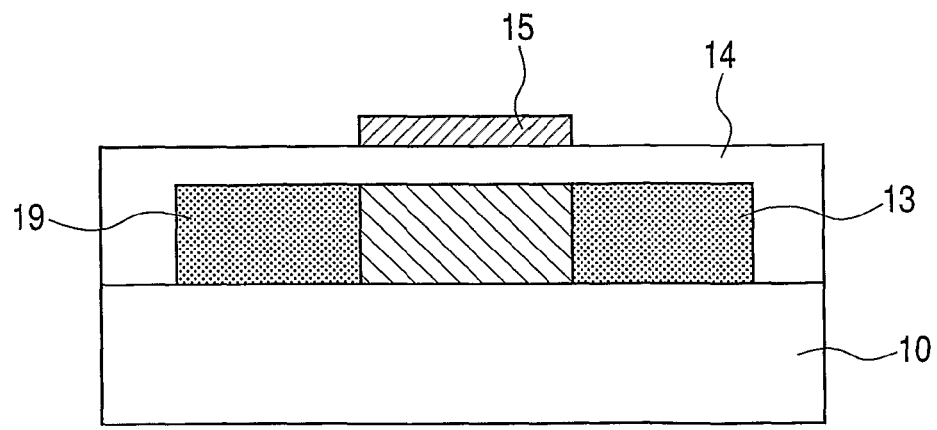
FIG. 3 is a cross-sectional view of a transistor which schematically illustrates regions where the electrical conductivity of an oxide semiconductor is increased during the course of manufacturing a top-gate/top-contact thin film transistor in annealing in an atmosphere containing moisture according to the present invention.

FIG. 3 is a cross-sectional view of a transistor which schematically illustrates regions where the electrical conductivity of an oxide semiconductor is increased during the course of manufacturing a top-gate/top-contact thin film transistor at a step of annealing in an atmosphere containing moisture according to the present invention.

Here, the oxide semiconductor layer 13, the gate insulating layer 14, and the gate electrode 15 are formed in the above-mentioned way illustrated in FIG. 2. By annealing in an atmosphere containing moisture according to the present invention after the gate electrode 15 is formed, an effect similar to that described with reference to FIG. 2 can be obtained. Then, after the interlayer insulating layer is selectively formed by the same means as used in forming the gate insulating layer, contact holes are formed, and then, the source electrode and the drain electrode are formed to complete the field-effect transistor.

Figure 4:
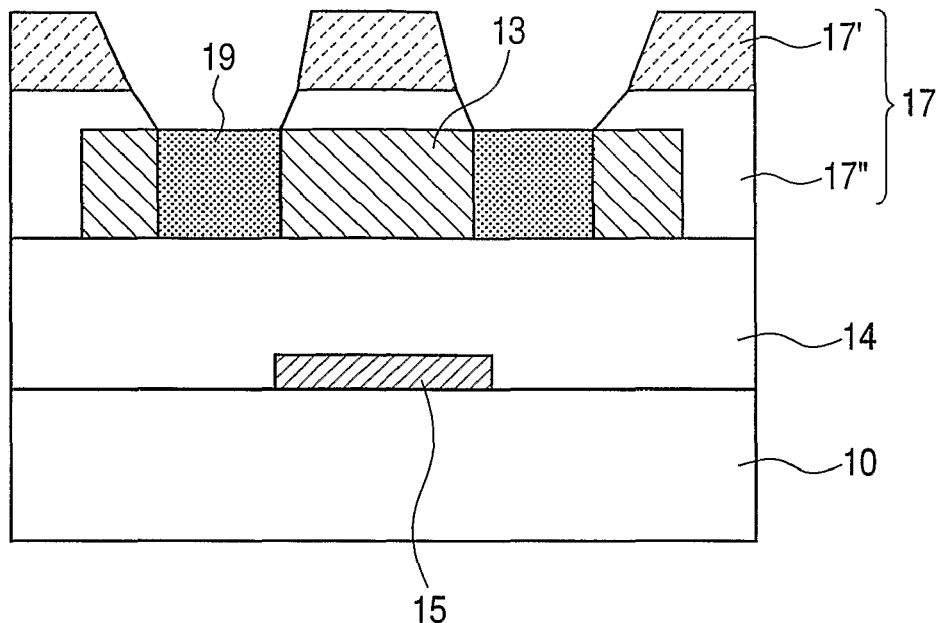
FIG. 4 is a cross-sectional view of a transistor which schematically illustrates regions where the electrical conductivity of an oxide semiconductor is increased during the course of manufacturing a bottom-gate reverse stagger thin film transistor in annealing in an atmosphere containing moisture according to the present invention.

FIG. 4 is a cross-sectional view of a transistor which schematically illustrates regions where the electrical conductivity of an oxide semiconductor is increased during the course of manufacturing a bottom-gate reverse stagger thin film transistor at a step of annealing in an atmosphere containing moisture according to the present invention.

In FIG. 4, the gate electrode 15, the gate insulating layer 14, the oxide semiconductor layer 13, and the protective layer 17 are formed in the same way as described above with reference to FIG. 2. The protective layer is formed in the same way as in the gate insulating layer is formed, where the protective layer is required to have the effect of masking against steam in the annealing step. Therefore, it is desirable that the protective layer have a stacked structure having an oxide insulating layer portion 17" such as $SiO_x$ in contact with the oxide semiconductor layer 13 and a portion 17' of a low steam permeability material such as $SiN_x$ superimposed thereon. The contact holes are formed in the protective layer to obtain the form illustrated in FIG. 4. By annealing in an atmosphere containing moisture in this process, the electrical conductivity of the oxide semiconductor can be increased.

After that, the source electrode and the drain electrode are formed to complete the field-effect transistor. At that time, because the above-mentioned protective layer functions as an etching stopper, the patterning of the source electrode and the drain electrode is not affected by the etching selection ratio with respect to the oxide semiconductor.

Further, in the process of manufacturing the bottom-gate reverse stagger thin film transistor, the following is adoptable. The step of annealing in an atmosphere containing moisture according to the present invention can be carried out after the source electrode and the drain electrode are formed by selecting as the source electrode and the drain electrode a material having steam permeability such as ITO.

Figure 5:
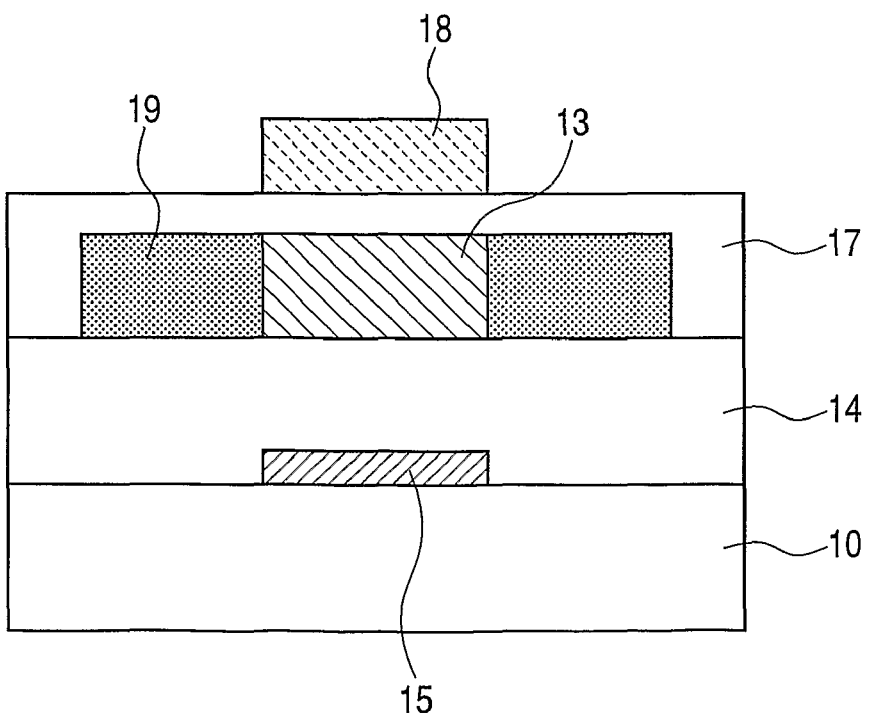
FIG. 5 is a cross-sectional view of a transistor which schematically illustrates regions where the electrical conductivity of an oxide semiconductor is increased during the course of manufacturing a bottom-gate reverse stagger thin film transistor in annealing in an atmosphere containing moisture according to the present invention in a way different from that illustrated in FIG. 4.

FIG. 5 schematically illustrates a cross-sectional view of a transistor which can be annealed in an atmosphere containing moisture according to the present invention during the course of manufacturing a bottom-gate reverse stagger thin film transistor, manufactured in the steps different from those illustrated in FIG. 4, and regions where the electrical conductivity of an oxide semiconductor is increased.

In FIG. 5, the gate electrode 15 made of metal, the gate insulating layer 14, the oxide semiconductor layer 13, and the protective layer 17 are formed in the same way as described above with reference to FIG. 2. A channel cover 18 having low steam permeability is formed on the protective layer 17. This formation of the channel cover 18 having low steam permeability is one of the characteristics of an embodiment of the present invention. The channel cover 18 can be formed in a self-aligning manner in a channel portion utilizing transparency of the oxide semiconductor 13 with the gate electrode 15 used as an exposure mask. As the material of the channel cover 18, a photosensitive resin used in a photolithography process can be used if the film thickness is several micrometers. In this way, the form illustrated in FIG. 5 is obtained. By annealing in an atmosphere containing moisture in this process, such an effect as described with reference to FIG. 2 can be obtained.

In this structure, differently from the case illustrated in FIG. 4, the protective layer is not required to have the effect of masking against steam. Further, the channel cover 18 may be removed after the step of annealing in an atmosphere containing moisture. After this process, the source electrode and the drain electrode are formed to complete the field-effect transistor. At that time, similarly to the description with reference to FIG. 4, because the above-mentioned protective layer functions as an etching stopper, the patterning of the source electrode and the drain electrode is not affected by the etching selection ratio with respect to the oxide semiconductor.

Figure 6:
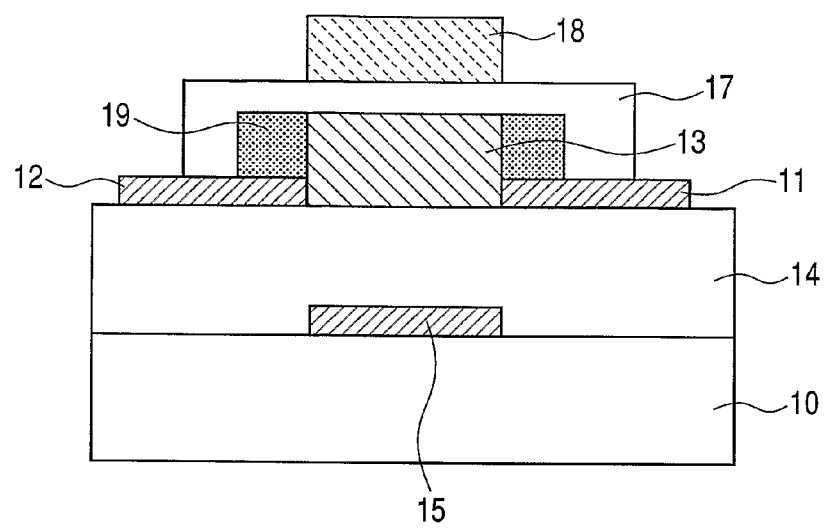
FIG. 6 is a cross-sectional view of a transistor which schematically illustrates regions where the electrical conductivity of an oxide semiconductor is increased during the course of manufacturing a bottom-gate/bottom-contact thin film transistor in annealing in an atmosphere containing moisture according to the present invention.

FIG. 6 is a cross-sectional view of a transistor which schematically illustrates regions where the electrical conductivity of an oxide semiconductor is increased during the course of manufacturing a bottom-gate/bottom-contact thin film transistor at the step of annealing in an atmosphere containing moisture according to the present invention.

In FIG. 6, the gate electrode 15 made of metal, the gate insulating layer 14, the source electrode 11 and the drain electrode 12 made of a transparent oxide conductor, the oxide semiconductor layer 13, and the protective layer 17 are formed in the same way as described above with reference to FIG. 2. Similarly to the description with reference to FIG. 5, the channel cover 18 having low steam permeability is formed on the protective layer 17. Thus, the channel cover 18 can be formed in a self-aligning manner in the channel portion utilizing transparency of the oxide semiconductor 13 with the gate electrode 15 used as an exposure mask. In this way, the form illustrated in FIG. 6 is obtained. By annealing in an atmosphere containing moisture in this process, such an effect as described with reference to FIG. 2 can be obtained.

In the following, the effect of annealing the oxide semiconductor in an atmosphere containing moisture according to the present invention is described in further detail.

It has been reported that, in annealing in an atmosphere containing moisture, which is usually known as steam oxidation, the strong oxidation power of steam improves the dielectric strength of a gate insulating layer formed of a silicon oxide film and reforms the interface between a semiconductor and an oxide insulating layer. However, according to findings of the present inventors, with regard to an oxide semiconductor, depending on conditions, the effect of reducing the resistance or of increasing the electrical conductivity is exhibited.

Figure 7:
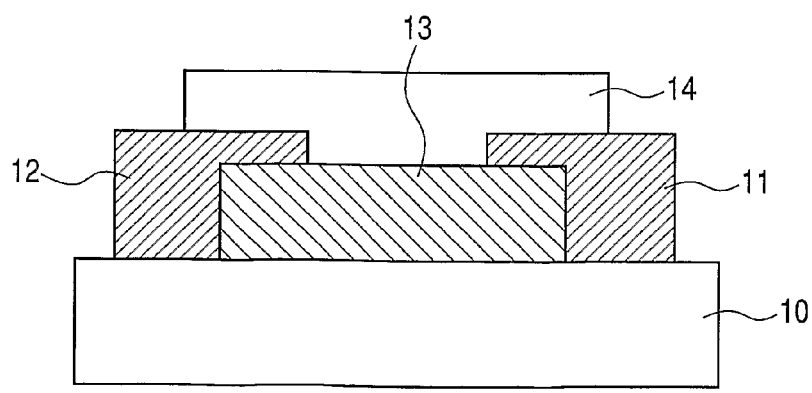
FIG. 7 is a graph illustrating the shape of a sample of an In—Ga—Zn—O amorphous oxide film when annealed in an atmosphere containing moisture according to the present invention.

FIG. 7 is a schematic cross-sectional view of a sample manufactured for measuring changes in the electrical conductivity of an In—Ga—Zn—O amorphous oxide film annealed in an atmosphere containing moisture. This is formed by patterning an $InGaZnO_4$ thin film having a film thickness of 20 nm on a Corning #1737 substrate (manufactured by Corning Inc.), forming electrodes, and then, forming by sputtering an $SiO_x$ film having a thickness of 100 nm as a protective layer.

Figure 8:
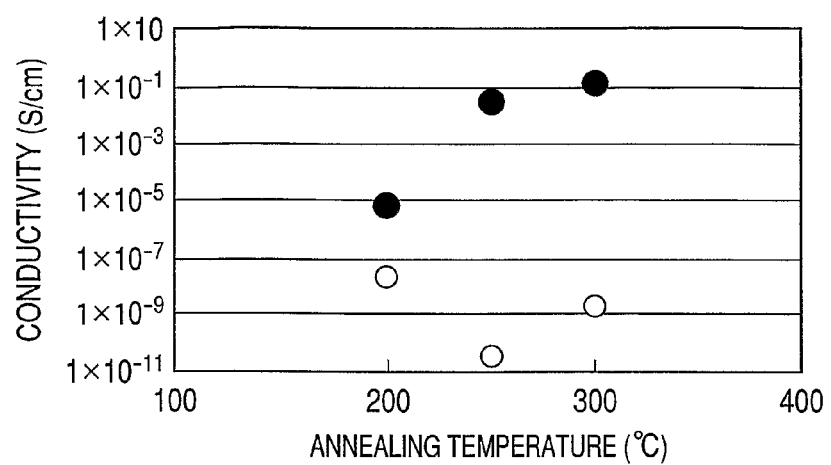
FIG. 8 is a graph showing changes in resistivity of an In—Ga—Zn—O amorphous oxide film when annealed in atmosphere containing moisture according to the present invention.

FIG. 8 illustrates the electrical conductivities of $InGaZnO_4$ thin films which are the sample illustrated in FIG. 7 after being annealed at 200° C., 250° C., and 300° C., respectively. "○" denotes electrical conductivities of the sample after being annealed in the air for one hour, and "●" denotes electrical conductivities of the sample after annealing is performed in the air at the respective temperatures for one hour, and further, steam annealing is performed at the same temperatures for one hour. The steam annealing is performed by vacuum-enclosing the sample illustrated in FIG. 7 and pure water in a glass tube. The amount of the pure water at that time is adjusted to be about two atmospheres at the annealing temperatures. As illustrated in FIG. 8, it is found that, by performing steam annealing, because water or steam goes through the $SiO_x$ insulating layer with a film thickness of 100 nm to reach the oxide semiconductor, the electrical conductivity of the oxide semiconductor is increased as compared with the case of the annealing in the air. The result shows the existence of the effect of increasing the carrier density of the oxide semiconductor by water or steam aside from the thermal effect of the annealing. This effect of increasing the carrier density is thought to be due to the addition of H atoms by steam to the oxide semiconductor. The result also shows that moisture in the air is insufficient to obtain the above-mentioned effect, and also suggests that the effect of increasing the electrical conductivity depends on the amount of moisture in the annealing atmosphere. More specifically, the above-mentioned effect can be obtained when the saturated vapor pressure at the step of annealing in an atmosphere containing moisture is higher than the saturated vapor pressure in the air at the annealing temperature.

As stated above, Japanese Patent Application Laid-Open No. 2007-311404 discloses that in order to sufficiently proceed with oxidation due to heat treatment, oxygen radicals, oxygen, steam and ozone are used. However, the resistance-reducing effect of the present invention is not one obtained by heat treatment in an oxidative atmosphere typified by the air, but one peculiar to annealing in an atmosphere containing moisture for an oxide semiconductor. In addition, it is essential that the insulating layer formed on the oxide semiconductor is steam-permeable.

Further, according to findings of the present inventors, the step of annealing in an atmosphere containing moisture can be carried out at 100° C. or higher and lower than 500° C. As being well known, the pressure of steam is higher than the atmospheric pressure at 100° C. or higher, where steam can be stably obtained. In that sense, the step of annealing in an atmosphere containing moisture can be stably realized at 100° C. or higher. According to findings of the present inventors, as the saturated vapor pressure becomes higher, steam goes through the $SiO_x$ insulating layer more easily. As the temperature becomes higher, the saturated vapor pressure becomes higher. From the above relationships, according to the present invention, the temperature of steam is preferably 120° C. or higher, and more preferably 200° C. or higher. For example, when the temperature is 120° C. or higher, a saturated vapor pressure of two atmospheres can be obtained. Further, the steam permeability of the $SiO_x$ insulating layer greatly correlate with the steam pressure, and it is thought that as the steam pressure becomes higher, the permeability becomes higher. The steam pressure with which a change in electrical conductivity was observed as illustrated in FIG. 8 was about two atmospheres. Taking into consideration the steam permeability of the $SiO_x$ insulating layer, at 120° C. or higher, steam is thought to go through the $SiO_x$ insulating layer with a film thickness of 100 nm and is effectively supplied to the surface of the oxide semiconductor.

Further, in high temperature region, as being described in K. Nomura et. al, Nature 432, 488 (2004), by annealing at 500° C. or higher, a phase change in a solid state from an amorphous phase to a crystal phase is started to occur, where it is very difficult to obtain monocrystals, and polycrystals are expected to be obtained. Because polycrystals induce variations in characteristics of the thin film transistor due to generation of grain boundaries, it is not good as "the step of annealing in an atmosphere containing moisture" which is a main portion of the present invention.

As being clear from the result of steam annealing at 200° C., according to the present invention, the electrical conductivity of the entire oxide semiconductor channel layer can be increased and controlled. FIGS. 1A to 1D schematically illustrate the cross-sectional views of the transistor in the annealing step in an atmosphere containing moisture and the regions in which the electrical conductivities of the oxide semiconductors are increased. In general, the electrical conductivity of an oxide semiconductor layer is controlled by adjusting the oxidation conditions in the film formation process, specifically, the oxygen gas content in a sputtering method or a PLD method. However, a decrease in the electrical conductivity of an oxide semiconductor due to an increasing in the oxygen content is very rapid, and control including reproducibility is difficult in some cases. In oxide semiconductors, there is a case where the oxide channel layer is formed under such a condition that an electrical conductivity is too low for a semiconductor (i.e., a resistivity is too high), and the reproducibility of the oxide channel layer characteristics is secured, and then, the electrical conductivity is increased by annealing. In such a case, temperature not lower than 300° C. comes to be necessary. Due to annealing in an atmosphere containing moisture according to the present invention, the electrical conductivity can be increased at temperature as low as not higher than 250° to bring about desired semiconductor properties. In this case, from the viewpoint of controlling the electrical conductivity so as to function as a semiconductor, the steam temperature is preferably 120° or more and 250° or less, and more preferably 120° or more and 200° or less.

In the following, a display apparatus using a transistor manufactured by a method for manufacturing a field-effect transistor according to the present invention is described.

The display apparatus can be assembled by coupling an output terminal, that is, a drain of the field-effect transistor formed by the method of the present invention to an electrode of a display device such as an organic or inorganic electroluminescent (EL) device or a liquid crystal device. A display apparatus will be described in detail below with reference to a cross-sectional view of the display apparatus.

Figure 9:
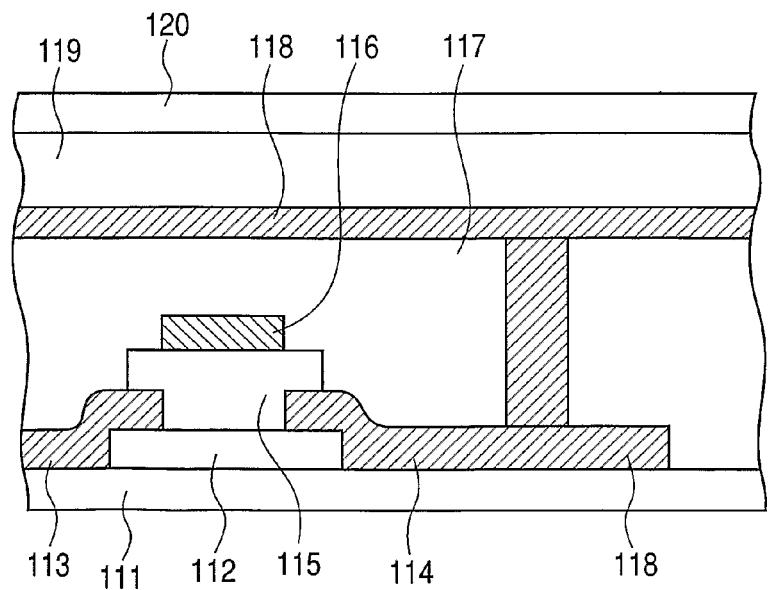
FIG. 9 is a cross-sectional view of an example of a display apparatus according to the present invention.

As illustrated in FIG. 9, a field-effect transistor includes on a substrate 111 an oxide film (channel layer) 112, a source electrode 113, a drain electrode 114, a gate insulating film 115, and a gate electrode 116. The drain electrode 114 is electrically connected to a first electrode 118 via an interlayer insulating film 117. The first electrode 118 is in contact with a luminescent layer 119 which is in contact with a second electrode 120. Thus, an electric current to be supplied to the luminescent layer 119 can be controlled by an electric current flowing through a channel of the oxide film 112 from the source electrode 113 to the drain electrode 114. The electric current to be supplied to the luminescent layer 119 can therefore be controlled by the voltage of the gate electrode 116 of the field-effect transistor. The first electrode 118, the luminescent layer 119, and the second electrode 120 constitute an inorganic or organic electroluminescent device.

Figure 10:
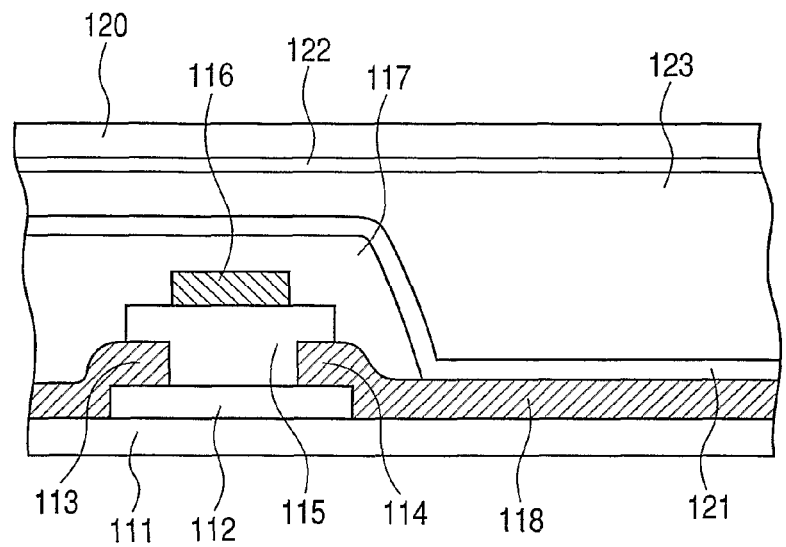
FIG. 10 is a cross-sectional view of another example of a display apparatus according to the present invention.

Alternatively, as illustrated in FIG. 10, an extended drain electrode 114 serves also as a first electrode 118. A voltage is applied via the first electrode 118 to a liquid crystal cell or an electrophoretic particle cell 123 interposed between high-resistance films 121 and 122. The liquid crystal cell or the electrophoretic particle cell 123, the high-resistance films 121 and 122, the first electrode 118, and the second electrode 120 constitute a display device. A voltage to be applied to the display device can be controlled by an electric current flowing through the channel of the amorphous oxide semiconductor film 112 from a source electrode 113 to the drain electrode 114. The voltage can therefore be controlled by the voltage of a gate electrode 116 of the TFT. When the display medium of the display device is a capsule containing a fluid and particles enclosed in an insulating film, the high-resistance films 121 and 122 can be eliminated.

Next, a display apparatus including a plurality of two-dimensionally arranged pixels is described below with reference to FIG. 11. The pixels include an EL device (here, referred to as an organic EL device) and a field-effect transistor.

Figure 11:
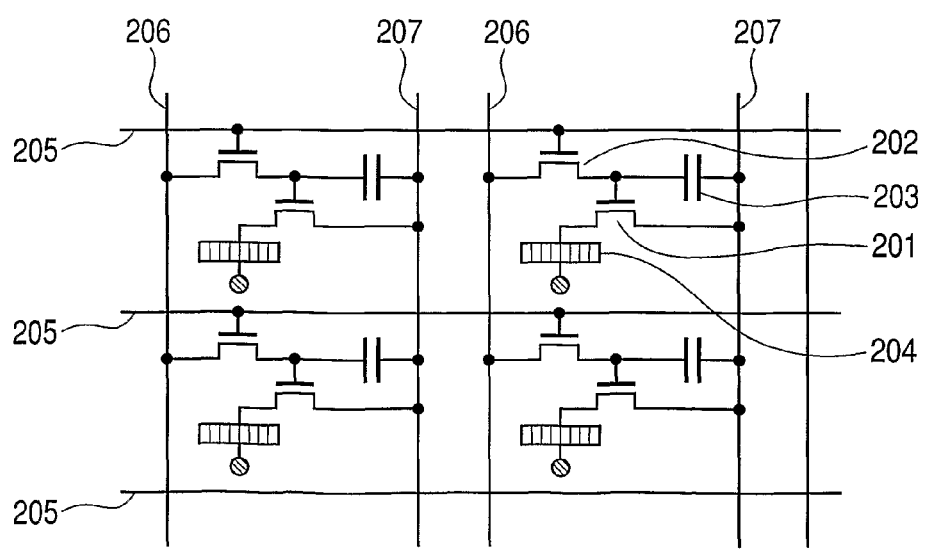
FIG. 11 is a view illustrating a structure of a display apparatus in which pixels including organic EL devices and thin film transistors are two-dimensionally arranged.
Figure 12A:
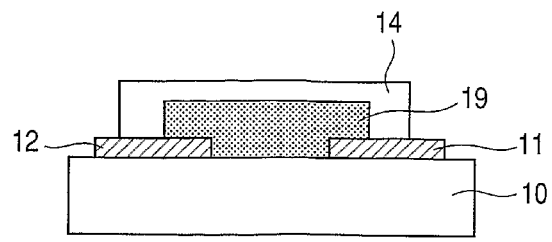
FIGS. 12A, 12B, 12C, and 12D are cross-sectional views when, in the field-effect transistors shown in FIGS. 1A, 1B, 1C, and 1D, the electrical conductivities of the entire oxide semiconductors are increased.
Figure 12B:
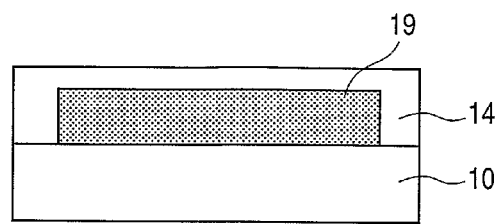
Figure 12C:
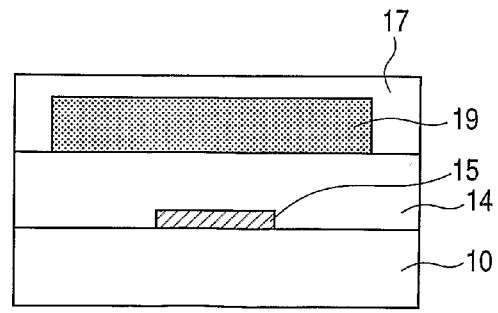
Figure 12D:
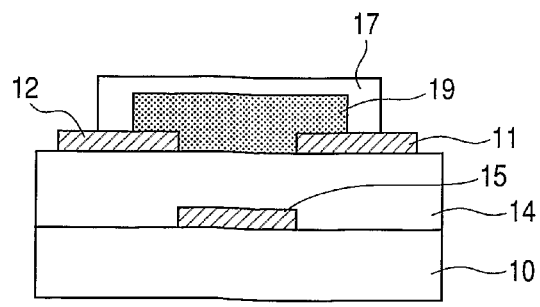

In FIG. 11, a transistor 201 which drives an organic EL layer 204 and a transistor 202 which selects pixels is illustrated. A capacitor 203 retains a selected state, stores electric charges between a common electrode line 207 and a source electrode of the second transistor 202, and retains the gating signal of the first transistor 201. Pixels are selected through a scanning electrode line 205 and a signal electrode line 206.

More specifically, a picture signal is sent from a driver circuit (not shown) to a gate electrode through a scanning electrode line 205 as a pulse signal. Simultaneously, a picture signal is sent from another driver circuit (not shown) to the transistor 202 through the signal electrode line 206 as a pulse signal. Thus, pixels are selected. Then, the transistor 202 is turned on to store electric charges in the capacitor 203 disposed between the signal electrode line 206 and the source electrode of the transistor 202. Thereby, the gate voltage of the first transistor 201 is maintained at a desired voltage, and the first transistor 201 is turned on. This state is held until the next signal is received. While the first transistor 201 is in an "ON" state, a voltage and an electric current are continuously supplied to the organic EL layer 204, thereby maintaining luminescence.

In the display apparatus illustrated in FIG. 11, one pixel includes two transistors and one capacitor. However, one pixel may include three or more transistors to improve the performance.

EMBODIMENTS

In the following, embodiments of the present invention are described, but the present invention is by no means limited to those embodiments.

Embodiment 1

FIG. 1A illustrates a method for manufacturing a top-gate stagger field-effect transistor.

An electrode layer for forming a source electrode and a drain electrode is formed on a glass substrate 10 (1737, manufactured by Corning Inc.) by sputtering. The electrodes are formed of indium tin oxide (ITO) and have a thickness of 50 nm.

Then, the electrode layer is patterned by photolithography and etching to form the source electrode 11 and the drain electrode 12.

Next, an In—Zn—Ga—O oxide amorphous semiconductor layer 13 having a thickness of 30 nm is formed on the glass substrate 10 having the source electrode 11 and the drain electrode 12. The oxide semiconductor layer is formed with a radio frequency (RF) sputtering apparatus at a substrate temperature of room temperature (25° C.). A target is a three-inch polycrystalline sintered compact having an $In_2O_3.ZnO$ composition. The RF input power is 200 W. The total pressure of the atmosphere when the film is formed is 0.5 Pa, and the gas flow rate at that time is $Ar:O_2$=95:5. Then, the oxide semiconductor layer 13 is patterned by photolithography and etching.

A gate insulating layer 14 and a gate electrode 15 are then formed.

The gate insulating layer 14 is formed of $SiO_2$ as a target by sputtering and has a thickness of 100 nm. The gate insulating layer 14 is patterned by photolithography and lift-off.

The gate electrode 15 is formed of Mo by sputtering and has a thickness of 100 nm. Further, the gate electrode 15 is patterned by photolithography and etching.

Then, a pressure steam oven is used to conduct annealing at two atmospheres and 250° C. for an hour to increase the electrical conductivity of an In—Zn—Ga—O amorphous oxide semiconductor in regions in contact with the source electrode 11 and the drain electrode 12. In this way, the field-effect transistor according to the present invention is completed.

The field-effect transistor manufactured according to this embodiment can achieve excellent characteristics with regard to hysteresis characteristics, uniformity, high-speed operability, and the like.

Embodiment 2

FIG. 1B illustrates a method for manufacturing a top-gate/top-contact field-effect transistor.

First, an In—Zn—Ga—O amorphous oxide semiconductor layer 13 is formed at a thickness of 50 nm on the glass substrate 10 (1737, manufactured by Corning Inc.) illustrated in FIG. 1B. The oxide semiconductor film is formed by an RF sputtering apparatus with the substrate temperature of room temperature (25° C.). A three-inch polycrystalline sintered compact having an $In_2O_3.ZnO$ composition is used as the target, and the RF input power is 200 W. The total pressure of the atmosphere when the film is formed is 0.5 Pa, and the gas flow rate at that time is $Ar:O_2=93:7$. After that, photolithography technology and etching technology are used to pattern the oxide semiconductor layer 13.

Next, the gate insulating layer 14 and a gate electrode 15 are formed.

The gate insulating layer 14 is formed of $SiO_2$ as a target by sputtering and has a thickness of 100 nm. The gate insulating layer 14 is patterned by photolithography and lift-off.

The gate electrode 15 is formed of Mo by sputtering and has a thickness of 100 nm. Further, the gate electrode 15 is patterned by photolithography and etching.

Then, a pressure steam oven is used to conduct annealing at two atmospheres and 250° C. for an hour to increase the electrical conductivity of an In—Zn—Ga—O amorphous oxide semiconductor in regions in contact with the source electrode 11 and the drain electrode 12. In this way, the structure illustrated in FIG. 3 is obtained.

After that, the interlayer insulating layer 16 made of $SiN_x$ is formed by sputtering at a thickness of 300 nm, and the contact holes are formed by photolithography and etching. Finally, the source electrode and the drain electrode made of Mo are deposited by sputtering at a thickness of 200 nm, and are patterned by photolithography and etching. In this way, the field-effect transistor according to the present invention is completed.

The field-effect transistor manufactured according to this embodiment can achieve excellent characteristics with regard to hysteresis characteristics, uniformity, high-speed operability, and the like.

Embodiment 3

FIG. 1C illustrates a method for manufacturing a bottom-gate top-contact field-effect transistor.

First, the gate electrode 15 is patterned and formed on the substrate 10 (1737, manufactured by Corning Inc.) using photolithography technology and etching technology. The electrode is formed of Mo at a thickness of 50 nm on the glass substrate 10 by sputtering.

Next, with regard to the gate insulating layer 14, $SiO_2$ is used as the target, and an $SiO_2$ film with a thickness of 200 nm is formed by sputtering. Further, an In—Zn—Ga—O amorphous oxide semiconductor material with a thickness of 30 nm is used as the oxide semiconductor film 13.

The oxide semiconductor film is formed by using an RF sputtering apparatus with the substrate temperature of room temperature (25° C.). A three-inch polycrystalline sintered compact having an $In_2O_3.ZnO$ composition is used as the target, and the RF input power is 200 W. The total pressure of the atmosphere when the film is formed is 0.5 Pa, and the gas flow rate at that time is $Ar:O_2=95:5$. After that, photolithography technology and etching technology are used to pattern the oxide semiconductor layer 13.

Then, the protective layer 17 which serves also as an etching stopper layer, the source electrode 11 and the drain electrode 12 are formed.

As the protective layer 17 which serves also as an etching stopper layer, a stacked structure of $SiO_2$ and $SiN_x$ is used. $SiO_2$ and $Si_3N_4$ are used as the target, and $SiO_2$ with a thickness of 100 nm and $SiN_x$ with a thickness of 300 nm in this order are sequentially deposited by sputtering. Further, the contact holes are formed in the protective layer 17 by photolithography and etching.

As the electrode material of the source electrode 11 and the drain electrode 12, indium tin oxide (ITO) is used, and the film thickness is 150 nm. The source electrode 11 and the drain electrode 12 are patterned by photolithography and etching.

Then, a pressure steam oven is used to conduct annealing at two atmospheres and 300° C. for an hour to increase the electrical conductivity of an In—Zn—Ga—O amorphous oxide semiconductor in regions in contact with the source electrode 11 and the drain electrode 12. In this way, the field-effect transistor according to the present invention is completed.

The field-effect transistor manufactured according to this embodiment can achieve excellent characteristics with regard to hysteresis characteristics, uniformity, high-speed operability, and the like.

Embodiment 4

This embodiment is an alternate process of Embodiment 3. FIG. 1C illustrates a method for manufacturing a bottom-gate top-contact field-effect transistor.

Up to the oxide semiconductor layer 13 is formed in the same way as in Embodiment 3. After that, with regard to the protective layer 17 which serves also as an etching stopper layer, $SiO_2$ is used as the target, $SiO_2$ is deposited at a thickness of 100 nm by sputtering, and the channel cover having low steam permeability is formed thereon. The channel cover is formed in a self-aligning manner in the channel portion utilizing transparency of the oxide semiconductor with the gate electrode being used as an exposure mask. Further, as the material of the channel cover, a photosensitive polyimide with a film thickness of 5 μm is used.

Then, a pressure steam oven is used to conduct annealing at two atmospheres and 300° C. for an hour to increase the electrical conductivity of an In—Zn—Ga—O amorphous oxide semiconductor in regions in contact with the source electrode 11 and the drain electrode 12. In this way, the structure illustrated in FIG. 5 is obtained. Next, using the channel cover as a mask, the contact holes are formed in the protective layer 17. At that time, the channel cover may be removed after the contact holes are formed.

As the electrode material of the source electrode 11 and the drain electrode 12, Mo is used, and the film thickness is 150 nm. The source electrode 11 and the drain electrode 12 are patterned by photolithography and etching. In this way, the field-effect transistor according to the present invention is completed.

The field-effect transistor manufactured according to this embodiment can achieve excellent characteristics with regard to hysteresis characteristics, uniformity, high-speed operability, and the like.

Embodiment 5

FIG. 1D illustrates a method for manufacturing a bottom-gate/bottom-contact field-effect transistor.

Up to the gate insulating layer 14 is formed in the same way as in Embodiments 3 and 4. After that, an electrode layer 17 for forming the source electrode and the drain electrode is formed by sputtering. With regard to the electrode material, Mo is used as the target, is deposited at a thickness of 200 nm by sputtering, and is patterned by photolithography and etching. Then, the In—Zn—Ga—O amorphous oxide semiconductor layer 13 is formed at a thickness of 50 nm. The oxide semiconductor film is formed by an RF sputtering apparatus with the substrate temperature of room temperature (25° C.). A three-inch polycrystalline sintered compact having an $In_2O_3 \cdot ZnO$ composition is used as the target, and the RF input power is 200 W. The total pressure of the atmosphere when the film is formed is 0.5 Pa, and the gas flow rate at that time is $Ar:O_2=90:10$. After that, photolithography technology and etching technology are used to pattern the oxide semiconductor layer 13. Then, with regard to the protective layer 17, $SiO_2$ is used as the target, and $SiO_2$ is formed at a thickness of 100 nm by sputtering. Further, $SiN_x$ is deposited at a thickness of 300 nm as a channel cover layer, and the channel cover 18 is patterned by photolithography and etching.

Then, a pressure steam oven is used to conduct annealing at two atmospheres and 300° C. for an hour to increase the electrical conductivity of an In—Zn—Ga—O amorphous oxide semiconductor in regions in contact with the source electrode 11 and the drain electrode 12. In this way, the field-effect transistor according to the present invention is completed.

The field-effect transistor manufactured according to this embodiment can achieve excellent characteristics with regard to hysteresis characteristics, uniformity, high-speed operability, and the like.

Embodiment 6

In each of the field-effect transistors shown in FIGS. 1A to 1D, a case is shown in which the electrical conductivity of the In—Zn—Ga—O amorphous oxide semiconductor layer 13 in its entirety is increased and controlled to the optimum conductivity for acting as a TFT.

In each of the field-effect transistors shown in Embodiments 1 to 4, the condition for forming the In—Zn—Ga—O amorphous oxide semiconductor layer is set at a gas flow rate of $Ar:O_2=80:20$, and the gate insulating layer 14 or the protective layer 17 is formed on the oxide semiconductor. After that, annealing is carried out for 1 hour at 200° C. at 2 atm using a pressure steam oven to increase the electrical conductivity of the In—Zn—Ga—O amorphous oxide semiconductor. The schematic views in this stage are shown in FIGS. 12A to 12D. Thereafter, the field-effect transistors in the present invention are completed in the same manner as in Embodiments 1 to 4 except for this process.

The field-effect transistor manufactured according to this embodiment can achieve excellent characteristics with regard to hysteresis characteristics, uniformity, high-speed operability, and the like.

Embodiment 7

This embodiment describes a display apparatus including a top-gate TFT.

The top-gate TFT is manufactured in the same manner as in Embodiment 1 or 2. The short sides of an ITO film forming a drain electrode are extended to 100 μm. Except for 90 μm of the extended portion, the TFT is covered with an insulating layer while the wiring is secured for a source electrode and a gate electrode. A polyimide film is applied thereon and subjected to a rubbing process.

At the same time, an ITO film and a polyimide film are formed on a plastic substrate in the same manner, and subjected to a rubbing process. The plastic substrate with the ITO film and polyimide film formed thereon is placed opposite to the substrate with the top-gate TFT formed thereon at a distance of 5 μm. The space between the substrates is filled with a nematic liquid crystal. Moreover, a pair of polarizing plates is provided on both sides of such a structure. When a voltage is applied to the source electrode of the top-gate TFT to change the voltage applied to the gate electrode, light transmittance is changed only in the 30 μm×90 μm portion of the ITO film extended from the drain electrode. The light transmittance can continuously be changed also with the voltage applied between the source electrode and the drain electrode at a gate voltage at which the top-gate TFT is in an ON state. A display apparatus including liquid crystal cells as display devices is thus manufactured, as illustrated in FIG. 9.

In this embodiment, the substrate on which the TFT is formed may be a white plastic substrate, each of the electrodes of the TFT may be formed of gold, and the polyimide film and the polarizer may be eliminated. A space between the white plastic substrate and a transparent plastic substrate is filled with capsules in which particles and a fluid are encapsulated in an insulating film. In a display apparatus having such a structure, a voltage applied between the extended drain electrode and the ITO film located in the upper portion is controlled by the TFT, so that the particles in the capsules move up and down, and thereby, display can be performed by controlling the reflectance of the extended drain electrode region viewed from the transparent substrate side.

In this embodiment, the TFTs may be formed adjacently to one another to form a current control circuit having, for example, a general four-transistor one-capacitor structure. One of the last stage transistors of the structure may be the TFF illustrated in FIG. 6 to drive an organic electroluminescent (EL) device. For example, the TFT including the above-mentioned ITO film serving as a drain electrode may be used. The organic EL device including a charge injection layer and a luminescent layer may be formed on the 30 μm×90 μm portion of the ITO film extended from the drain electrode. Thus, a display apparatus including the EL device can be manufactured.

Embodiment 8

The display devices according to Embodiment 4 and TFTs are two-dimensionally arranged. For example, 7,425×1,790 pixels each having a size of about 30 μm×115 μm are arranged at intervals of 40 μm in the short side direction and 120 μm in the long side direction of a rectangle. The pixels include the display devices according to Embodiment 4, such as liquid crystal cells or EL devices, and TFTs. 1,790 gate lines pass through the gate electrodes of the 7,425 TFTs in the long side direction. 7,425 signal lines pass through portions where the source electrodes of the 1,790 TFTs protrude by 5 μm from the amorphous oxide semiconductor film, in the short side direction. The gate lines are connected to a gate driver circuit. The signal lines are connected to a source driver circuit. In the case of a liquid crystal display device, a color filter having the same size as the liquid crystal display device may be appropriately placed on the liquid crystal display device to manufacture an A4-size active-matrix color image display apparatus having about 211 pixels per inch (ppi). In the color filter, red, green and blue (RGB) are repeated in the long side direction.

Also in the case of an EL device, a gate electrode of the first TFT of two TFTs included in the EL device is connected to a gate line, and a source electrode of the second TFT is connected to a signal line. The emission wavelengths of RGB are repeated in the long side direction of the EL device. Thus, an emissive color image display apparatus having the same resolution as the liquid crystal display device can be manufactured.

A driver circuit for driving an active-matrix may include the same TFT as the pixel TFT according to the present invention or an existing IC Chip.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-249231, filed Sep. 26, 2007, and No. 2008-223480, filed Sep. 1, 2008 which are hereby incorporated by reference herein in their entirety.

The invention claimed is:

1. A method for manufacturing a field-effect transistor including at least a source electrode, a drain electrode, an oxide semiconductor layer, a steam permeable insulating layer, and a gate electrode all formed on a substrate, the method comprising:
    after forming the steam permeable insulating layer on the oxide semiconductor layer, increasing electrical conductivity of the oxide semiconductor layer by annealing in an atmosphere containing moisture, wherein steam pressure during annealing is higher than saturated vapor pressure in the atmosphere at an annealing temperature.

2. A method for manufacturing a field-effect transistor according to claim 1, wherein the insulating layer is at least one of a gate steam permeable insulating layer and a protective layer.

3. A method for manufacturing a field-effect transistor according to claim 1, further comprising:
    forming the source electrode and the drain electrode on the substrate;
    forming the oxide semiconductor layer on the substrate with the source electrode and the drain electrode formed thereon;
    forming the steam permeable insulating layer as a gate insulating layer on the oxide semiconductor layer;
    forming the gate electrode on the gate steam permeable insulating layer; and
    performing the annealing in the atmosphere containing the moisture.

4. A method for manufacturing a field-effect transistor according to claim 1, further comprising:
    forming the oxide semiconductor layer on the substrate;
    forming the steam permeable insulating layer as a gate insulating layer on the oxide semiconductor layer;
    forming the gate electrode on the gate steam permeable insulating layer; and
    performing the annealing in the atmosphere containing the moisture.

5. A method for manufacturing a field-effect transistor according to claim 3, wherein the gate electrode is made of a metal having low steam permeability.

6. A method for manufacturing a field-effect transistor according to claim 1, further comprising:
    forming the gate electrode on the substrate;
    forming a gate insulating layer on the substrate with the gate electrode formed thereon;
    forming the oxide semiconductor layer on the gate insulating layer;
    forming the steam permeable insulating layer as a protective layer on the oxide semiconductor layer;
    forming a contact hole in the steam permeable insulating layer; and
    performing the annealing in the atmosphere containing the moisture,
    wherein the steam permeable insulating layer comprises an oxide steam permeable insulating material and is in contact with the oxide semiconductor layer and a low steam permeability material layer is formed theron to partially cover the steam permeable insulating layer.

7. A method for manufacturing a field-effect transistor according to claim 6, wherein
    the source electrode and the drain electrode are formed before the annealing in an atmosphere containing moisture, and
    a material of the source electrode and the drain electrode has steam permeability.

8. A method for manufacturing a field-effect transistor according to claim 1, further comprising:
    forming the gate electrode on the substrate;
    forming a gate steam permeable insulating layer on the substrate with the gate electrode formed thereon;
    forming the oxide semiconductor layer on the gate insulating layer;
    forming the steam permeable insulating layer as a protective layer on the oxide semiconductor layer;
    forming a channel cover on the steam permeable insulating layer; and
    performing the annealing in the atmosphere containing the moisture.

9. A method for manufacturing a field-effect transistor according to claim 1, further comprising:
    forming the gate electrode on the substrate;
    forming a gate insulating layer on the substrate with the gate electrode formed thereon;
    forming the source electrode and the drain electrode on the gate insulating layer, the source electrode and the drain electrode being made of a transparent oxide conductor;
    forming the oxide semiconductor layer on the gate electrode insulating layer with the source electrode and the drain electrode formed thereabove thereon;
    forming the steam permeable insulating layer as a protective layer on the oxide semiconductor layer;
    forming a channel cover on the protective steam permeable insulating layer; and
    performing the annealing in the atmosphere containing the moisture.

10. A method for manufacturing a field-effect transistor according to claim 8, wherein the channel cover is made of a material having low steam permeability.

11. A method for manufacturing a field-effect transistor according to claim 1, wherein the moisture is water, heavy water, steam, or heavy water steam.

12. A method for manufacturing a field-effect transistor according to claim 1, wherein the oxide semiconductor layer is made of an amorphous oxide material containing In, Ga, and Zn.

13. A method for manufacturing a field-effect transistor according to claim 1, wherein the annealing in the atmosphere containing the moisture is carried out at 100° C. or higher and lower than 500° C.

14. A method for manufacturing a field-effect transistor according to claim 1, wherein the steam permeable insulating layer formed on the oxide semiconductor layer is an oxide insulating layer.

* * * * *